United States Patent [19]
Beach et al.

[11] Patent Number: 4,948,623
[45] Date of Patent: Aug. 14, 1990

[54] METHOD OF CHEMICAL VAPOR DEPOSITION OF COPPER, SILVER, AND GOLD USING A CYCLOPENTADIENYL/METAL COMPLEX

[75] Inventors: David B. Beach, Yorktown Hgts.; Joseph M. Jasinski, Pleasantville, both of N.Y.

[73] Assignee: International Business Machines Corporation, Armonk, N.Y.

[21] Appl. No.: 415,452

[22] Filed: Sep. 29, 1989

Related U.S. Application Data

[63] Continuation of Ser. No. 313,333, Feb. 21, 1989, abandoned, which is a continuation of Ser. No. 251,967, Sep. 27, 1988, abandoned, which is a continuation of Ser. No. 68,695, Jun. 30, 1987, abandoned.

[51] Int. Cl.$^5$ .............................................. B05D 3/06
[52] U.S. Cl. .................................... 427/35; 427/53.1; 427/140; 427/252; 427/253; 427/255; 427/383.1
[58] Field of Search ................... 427/35, 53.1, 99, 252, 427/253, 255, 255.1, 383.1, 140, 142, 383.3, 383.5, 383.7; 428/457, 469, 938; 437/225

[56] References Cited

U.S. PATENT DOCUMENTS

| | | | |
|---|---|---|---|
| 3,018,194 | 1/1962 | Norman et al. | 427/252 |
| 3,071,493 | 1/1963 | Whaley et al. | 427/252 |
| 3,083,550 | 4/1963 | Averbach | 427/252 |
| 3,188,230 | 6/1965 | Bakish et al. | 427/252 |
| 3,375,129 | 3/1968 | Carley et al. | 427/252 |
| 4,009,297 | 2/1977 | Redmond et al. | 427/252 |
| 4,321,073 | 3/1982 | Blair | 427/255 |

FOREIGN PATENT DOCUMENTS 1446272  5/1969  Fed. Rep. of Germany ...... 427/252

*Primary Examiner*—Sadie Childs
*Attorney, Agent, or Firm*—Jackson E. Stanland

[57] ABSTRACT

Improved processes are described for the deposition of Cu and group IB metals such as Ag and Au. These processes include thermal CVD, photothermal depositions and photochemical deposition. The gaseous precursor which leads to successful deposition of high quality films at low temperatures includes a cyclopentadienyl ring, a two electron donor ligand, and the group IB metal in a +1 oxidation state. In addition, derivatives of the cyclopentadienyl ring can be used where the substituents on the ring include those selected from alkyl groups, halide groups, and psuedohalide groups. In addition, the two electron donor ligand can be selected from the group consisting of trivalent phosphines, amines and arsines. A representative precursor for the deposition of Cu is triethylphosphine cyclopentadienyl copper (I).

41 Claims, 1 Drawing Sheet

U.S. Patent   Aug. 14, 1990   4,948,623

METHOD OF CHEMICAL VAPOR DEPOSITION OF COPPER, SILVER, AND GOLD USING A CYCLOPENTADIENYL/METAL COMPLEX

This application is a continuation of Ser. No. 313,333, filed Feb. 21, 1989, which is a continuation of application Ser. No. 251,967filed Nov. 27, 1988 which is a continuation of application Ser. No. 068,695 filed Jun. 30, 1983, all now abandoned.

BACKGROUND OF THE INVENTION

1. Field of the Invention

This invention relates to chemical vapor deposition (CVD) of group IB metals, and specifically Cu, Ag, and Au, and more particularly to an improved CVD method wherein films of very high quality can be formed at low temperatures, using either thermal or radiation beam-induced CVD.

2. Description of the Related Art

The deposition of metals from the vapor phase is important in many industries, and in particular in the electronics industry. In this industry, metallic depositions are often undertaken, involving metals such as copper, silver, gold, tungsten, etc. In particular, these metals are often used for interconnection lines and in packaging for semiconductor chips, circuits, and packages. Another application of these metals is their deposition into vias, trenches, and other recesses or stepped structures. Such requirements and uses are apparent in the semiconductor industry and in packaging where multilevel interconnections through openings in insulating layers have to be provided.

In the environment of microelectronic circuitry and packaging, it is often the situation that low temperature processes are required in order to preserve the necessary characteristics of underlying layers. For example, most photosensitive resists cannot be subjected to temperatures above about 175° C. without losing their ability to be exposed, developed, and patterned. As another example, most polymer layers, such as polyimide, require processing temperatures less than the glass transition temperature of the polymer in order to maintain the desired properties of the polymer. Thus, it is important to provide a technique for depositing metal lines at temperatures which are sufficiently low that the technique can be used in the presence of other layers having temperature-sensitive properties.

In the microelectronics industry, as well as in other industries, it is also the situation that the deposition must occur onto substrates which have irregular topography. For example, in semiconductor structures, interconnection lines must often be provided over nonplanar surfaces, including those having steps defining an irregular surface. A technique providing conformal deposition, i.e., deposition of continuous layers over irregular substrates, is a necessity. In this type of an environment where conformal deposition is required, techniques such as evaporation and sputtering (which are line-of-sight techniques) cannot be used. For this purpose, CVD techniques are preferred. However, CVD of metals, while being generally known, has not been extensively practiced due to the following reasons, among others: poor film quality, requirement of high processing temperatures; incorporation of impurities and other defects in the deposited film; the inability to transport vapors of the metal complex without decomposition of the vapors, and the instability of the precursors used in the deposition systems. Most generally, it is desired to deposit films having excellent electrical conductivity, which means that the films must have minimal carbon and oxygen contamination. Presently known CVD techniques have not been successful, particularly with respect to providing films of very high quality.

Both thermal and laser-induced deposition of metals from the gas phase has been attempted in the art. Published studies have generally described metals and elements whose volatile precursors are readily available from commercial sources, usually metal alkyls or metal carbonyls. For example, chromium has been deposited from chromium carbonyl and cadmium has been deposited from dimethyl cadmium. These materials, and others, have been used for maskless writing of metals, microelectronic circuit fabrication, metal line repair, and metal mask repair.

A metal of considerable importance and one which has not heretofore been successfully deposited by CVD is copper. One reason may be the lack of a suitable precursor since copper carbonyl does not exist for practical purposes and copper alkyls are polymeric and nonvolatile. F. A. Houle et al, Appl. Phys. Lett. 46 (2), 15, Jan. 1985, at page 204 describes laser-induced CVD of copper using a volatile copper coordination complex. The precursor was bis-(1,1,1,5,5,5-hexafluoro-2,4-pentanedionate) copper (II), CuHF. This same compound was also used to make copper films by thermal CVD using a low pressure system as noted by Houle et al.

Thermal CVD of copper has previously been reported from other precursors such as $CuCl_2$ and $Cu(C_5H_7O_2)_2$. The copper chloride system requires the addition of hydrogen as a reductant, and operates at temperatures of 400°–1200° C. The products of the reaction are copper and hydrogen chloride, and a reasonable mechanism for this reaction probably involves disassociative chemisorption of both reactants followed by a surface reaction to make HCl which then desorbs. When copper is deposited from copper acetylacetonates, hydrogen is also required in most cases. Generally, the formation of copper from these sources produces poor material of high resistivity.

Another reference generally describing techniques for forming metals on glass surfaces is U.S. Pat. No. 4,321,073 to G. R. Blair. This reference mentioned laser beam dissociation of metal-containing compounds on a glass fiber in order to coat the fiber with the metal. Many classes of organo-transition metal complexes, coordination complexes and metal halides are mentioned in this reference, which is directed to the use of a radiant energy beam to heat the glass substrate in order to dissociate the metal-containing compound.

Other references generally describing the coating of the metal by heating a metal-containing compound include U.S. Pat Nos. 3,438,805; 4,478,890; and 4,574,095. In the first of these, a metal such as copper is coated by heating a metal salt/phosphine complex in the presence of the substrate. The second reference describes the deposition of nickel using a Ni-olefintrifluorophosphine complex which is decomposed. The last of these references describes Cu deposition using Pd seeds where a Pd-containing compound vapor is irradiated with laser light or exposed to a laser-heated substrate in order to reduce the compound vapor to Pd.

While the prior art generally recognizes the desirability of CVD of metals such as copper, the precursors and techniques previously tried have not been successful, for reasons such as those described hereinabove. In particular, these prior techniques require either unrealistically high processing temperatures or produce films that are contaminated with carbon and/or oxygen. The use of chloride precursors in particular has required high processing temperatures while the use of acetylacetonate precursors has led to the deposition of films with high levels of carbon and/or oxygen.

Accordingly, it is a primary object of the present invention to provide an improved technique for CVD of copper and other group IB metals wherein films of high quality can be deposited at low temperatures.

It is another object of this invention to provide improved CVD processes for the deposition of Cu, Ag, and Au films of high quality and good surface morphology.

The low temperature requirement for the deposition of transition metals is most easily met by the decomposition of an organometallic compound. However, for certain metals such as copper, this is made difficult by the instability of organocopper compounds and their tendency to form nonvolatile oligimers and polymers. For example, binary alkyl copper complexes undergo autocatalytic decomposition to alkanes or alkenes and copper metal at temperatures too low for the compounds to have sufficient volatility. This means that very little precursor will arrive at the substrate and large amounts of the reactants will be lost. In the case of binary arylcopper complexes, these materials are more stable but their oligomeric structure lowers their volatility to the point that decomposition occurs before transport. Again, this means that insufficient quantities of reactants will be delivered to the substrate.

It is another object of this invention to provide a class of precursor compounds which can be used in thermal CVD and laser induced CVD processes without the problems described in the previous paragraph.

It is another object of this invention to provide a unique class of precursor compounds which can be utilized in thermal and radiation beam-induced CVD to deposit copper and group IB metals of high quality at low temperatures.

It is another object of this invention to provide a class of improved precursors for thermal and light-induced CVD of Cu, Ag, and Au.

It is a further object of this invention to provide thermal and radiation beam-induced CVD of Cu, Ag, and Au layers on substrates wherein the layers that are deposited exhibit high quality and good surface morphology, and are continuous.

It is another object of this invention to provide an improved technique for the deposition of Cu, Ag, and Au films onto substrates of different shapes, the process providing high quality conformal deposition onto the substrates.

It is another object of this invention to provide an improved thermal and radiation beam-induced CVD process for depositing Cu, Ag, and Au, where the technique is directly applicable to the manufacture and processing of semiconductor devices and structures, being suitable for applications such as chip metallization and repair of conducting lines.

It is another object of this invention to provide an improved technique for thermal and radiation beam-induced CVD of Cu, Ag, and Au where the temperature used in the deposition can be tailored to be sufficiently low that these films can be deposited on substrates whose properties are very temperature-sensitive.

SUMMARY OF THE INVENTION

This invention broadly describes thermal and radiation beam-induced CVD processes for depositing high quality metals from group IB of the periodic table, and specifically Cu, Ag, and Au at low temperatures on all types of substrates. Broadly, thermal CVD includes any type of apparatus in which the substrate and/or the gaseous precursor is heated and could include standard thermal reactors such as cold wall, hot substrate reactors, as well as radiation beam reactors where a beam (such as a laser beam) is used to heat the substrate and/or gaseous precursor. However, in the art it is common to refer to these techniques separately so that thermal CVD implies the use of a thermal reactor (FIG. 1) while radiation beam-induced CVD implies the use of a beam apparatus such as that shown in FIG. 2.

The deposition techniques of this invention are based on the discovery of the applicability of molecules which can be used as a precursor for the deposition of these group IB metals. The invention is also based on the discovery that the quality of the metal film which is deposited depends on the oxidation state of the metal in the precursor molecule complex. Thus, the oxidation state of the metal in the precursor complex is +1, which is a distinction over the usual oxidation state (+2) used in prior art precursors.

In these CVD processes, the precursor is a compound containing a cyclopentadienyl ring, a neutral 2 electron donor ligand, and the group IB metal (Cu, Ag, Au) in a +1 oxidation state. The 2 electron donor ligand is selected from the group consisting of trivalent phosphines, amines, and arsines. The cyclopentadienyl ring can be replaced by a derivative of this ring, where the substituents on the ring would include those chosen from alkyl, halide, and psuedo halide groups. Thus, the precursor for thermal or radiation beam-induced CVD is a group IB metal cyclopentadienyl complex coordinated by a 2 electron donor ligand, such as a phosphine ligand. As an example of a suitable precursor complex for the deposition of copper, trialkylphosphine (cyclopentadienyl copper I) complexes have been successfully used to deposit analytically pure copper at temperatures between about 120° and 220° C.

In a typical CVD process, the substrate on which deposition is to occur is placed in a reactor and is heated to a temperature sufficient to cause the decomposition of vapors of the precursor complex. When these vapors are introduced into the reactor and transport to the vicinity of the substrate, they will decompose thereat to deposit the group IB metal. It is believed that the decomposition includes the initial dissociation of the 2 electron donor phosphine ligand, followed by the reduction of the group IB metal by the cyclopentadienyl ligand. The cyclopentadienyl ligand yields one electron to the group IB metal causing it to deposit onto the substrate. During this process, the cyclopentadienyl ligand is eliminated by dimerizing to a stable, volatile molecule that takes the carbon atoms with it.

No other precursors are known which will provide high quality, substantially pure copper deposits on a plurality of substrates at low temperatures. All previously known precursors for copper deposition do not yield analytically pure copper, but instead yield copper having ligands, carbon, and oxygen in the deposited metals. Additionally, no phosphorous, or insubstantial amounts, appear in the deposited copper film when this precursor is used. The low temperature chemistry of this decomposition reaction, the use of the metal to be deposited in the +1 oxidation state, and the chemistry wherein the cyclopentadienyl ring dimerizes to produce a stable and volatile molecule allowing the deposition of a clean metal, are all features which are not taught or suggested by the art, and have been discovered only through applicants' experimentation.

Any type of substrate can be used, including metals, semiconductors, insulators, polymers, ceramics etc. In a thermal reactor CVD system, it is preferable that the decomposition reaction occur at the substrate, and for this reason it is preferable to heat the substrate to a temperature in excess of the decomposition temperature of the precursor complex. In a radiation beam-induced CVD technique, the radiation (such as a laser beam) is preferably used to heat the substrate so that the decomposition of the precursor occurs at the substrate. If the radiation wavelength is such that it is absorbed via an electronic transition by the precursor molecule to cause a photochemical change that alters the decomposition process, it has been found that the quality of the deposited film may not be as good as that of the films formed when the radiation is instead only used to heat the substrate and/or gaseous precursor (i.e., when no photochemical change occurs).

These CVD processes can be used to provide blanket deposition of Cu, Ag, and Au on substrates, as well as to provide deposition of these metals on selected areas of the substrate, or deposition through a masking material, such as a resist material. Further, these processes provide conformal deposition so that the metals can be deposited as continuous layers into recesses, trenches, and vias, and over stepped surfaces.

These and other objects, features, and advantages will be apparent from the following more particular description of the preferred embodiments.

DESCRIPTION OF THE PREFERRED EMBODIMENTS

Figure 1:
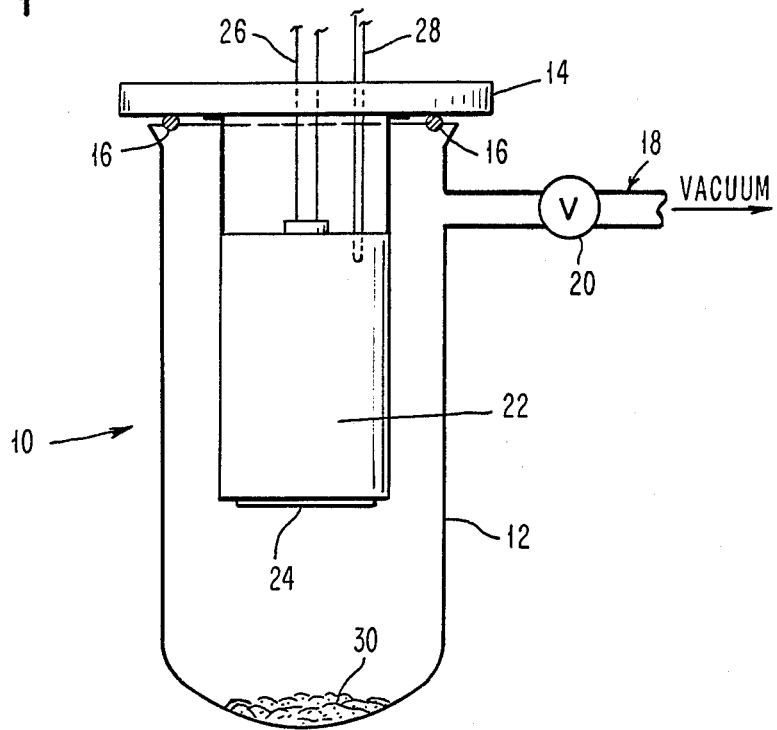
FIG. 1 schematically represents one of many different types of apparatus that can be used for thermal CVD in accordance with the principles of the present invention.

This invention broadly relates to CVD of Cu and group IB metals such as Ag and Au onto substrates, where the CVD process can be either thermally driven or radiation beam-induced. Generally, the substrate onto which deposition is to occur is heated in order to have the decomposition reaction occur at the substrate. As noted, if the gaseous precursor is photochemically decomposed by UV radiation in the gas phase, the quality of the deposited film may not be as high as when the decomposition reaction occurs thermally at either the substrate surface or in the gas phase. Generally, if the decomposition reaction is as noted, the purity of the deposited film will be excellent.

In a suitable thermal CVD process, the apparatus is generally a cold wall, hot substrate apparatus in which vapors of the precursor complex travel to the substrate and decompose thereat in order to deposit the metal. In a radiation beam-induced process in accordance with this invention, the radiation is preferably directed to the substrate surface in order to heat the surface. If the radiation is absorbed by the gaseous precursor and causes photochemical changes therein, impurities may be found in the deposited film and its quality will not be as high. The term "radiation beam-induced" refers to any type of radiation which can be used to heat the substrate and/or gas precursor and includes, for example, both light and electron beam radiation. Thus, radiation can be used to provide thermal CVD, as for example when IR radiation is used to heat the gaseous precursor. If the wavelength of the radiation is such that a photochemical change occurs in the precursor, a nonthermal effect will be present that may alter the products of decomposition and render the film less pure. In a preferred embodiment, the light is produced by a laser which is focused and directed to a substrate in order to heat the substrate to a temperature sufficient to decompose the gaseous precursor.

For deposition in accordance with this invention, a unique precursor complex is used. This complex includes a cyclopentadienyl ring, a 2 electron donor ligand, and the group IB transition metal which is in a +2 oxidation state. Derivatives of the cylopentadine ring include substituents selected from the class including alkyl groups, halide groups, and psuedo halide groups. As known by those of skill in the art, the alkyl groups include, for example, methyl ($CH_3$), ethyl ($C_2H_5$), propyl ($C_3H_7$), butyl ($C_4H_9$), etc. groups. The 2 electron donor ligand gives stability to the cyclopentadienyl metal complex in order to allow it to be transportable without decomposition, and is a ligand selected from the group consisting of trivalent phosphines, amines, and arsines. As an example, a precursor for the chemical vapor deposition of high quality copper films is triethylphosphine cyclopentadienyl copper (I). This complex was first prepared by Wilkinson in 1956 as reported in G. Wilkinson et al, J. Inorganic Nuclear Chemistry, 2, 32, (1956).

A systematic procedure for the synthesis of compounds of the formula $C_5H_5CuL$, where L is a 2 electron donor ligand, was developed by Marks and Cotton in 1970, as explained by F. A. Cotton and T. J. Marks, J. Am. Chem. Soc., 92, 5114 (1970). In their paper, Marks and Cotton report that the cyclopentadienyl copper complexes of carbon monoxide and methyl isocyanide deposit metallic copper from solution on standing at room temperatures, and that the trimethylphosphite complex slowly deposits copper from the solid at room temperature. No mention was made of the decomposition products of phosphine complexes.

The order of stability appears to correlate strongly with the sigma donor abilities of the ligand. This implies that the rate limiting step in these decomposition reactions is the dissociation of the two electron donor ligand. As will be seen further, cyclopentadienyl copper adducts of triethylphosphine, trimethylphosphine, and tributylphosphine have been used to deposit copper films of high purity by chemical vapor deposition. All of these compounds will deposit copper in the 150°-220° C. range and all have sufficient vapor pressure to transport in a vacuum system without decomposition. As noted, these adducts of cyclopentadienyl copper (I) can be prepared by the technique 7, Cotton and Marks. The previously unreported trimethylphosphine derivative is prepared by a modification of this procedure in which the solvent and the phoshine are changed. The solvent is changed from hexane to diethyl ether while the phosphine is changed from trimethylphosphine to triethylphosphine. The rest of the procedure is exactly that described by Cotton and Marks.

These compounds all have a "half-sandwich" structure with a pentahapto-cyclopentadienyl ring (all five carbon atoms bound to the transition metal). The structure of a triethylphosphine derivative of the cyclopentadienyl copper I complex is shown below:

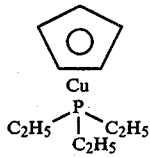

In the following discussion concerning the decomposition of these precursors, it will be assumed that the metal to be deposited is Cu. A similar decomposition process would occur if the metal were another group IB metal such as Ag and Au. Thus, it is proposed that the mechanism of decomposition of all C$_5$H$_5$CuL compounds is loss of the ligand L as the rate determining step, followed by the formation of an unstable cyclopentadienyl copper species which decomposes by a homolytic cleavage of the copper-carbon bond. The order of stability of the precursor appears to correlate strongly with the sigma donor abilities of the two electron donor ligand. After dissociation of the donor ligand, a rapid decomposition of the 16 electron C$_5$H$_5$Cu fragments results. The Cu$^{+1}$ is converted to Cu$^0$ by the addition of an electron from the cyclopentadienyl ring after which the cyclopentadienyl ligand is eliminated by dimerization to a stable, volatile molecule that takes the carbon atoms with it. The stability trend and evidence suggests that the organic product of the decomposition is 9, 10-dihydrofulvalene. This further suggests that the mechanism for the decomposition of the alkyl phosphine cyclopentadienyl copper complexes is the surface adsorption and dissociation of the molecules to give free alkylphosphine and unstable adsorbed cyclopentadienyl copper. This is followed by coupling of the organic radical fragments which then desorb, leaving a pure copper film.

As noted, these group IB metals can be deposited on many different types of substrates, including metal, semiconductors such as silicon, insulators such as SiO$_2$, and polymers. Generally, transition metal surfaces catalyze the deposition of other metals thereon, and require less heating in order to have the decomposition reaction occur.

Although the decomposition of the precursor begins somewhat at about 70° C., a somewhat higher temperature (at least about 120° C.) is generally required to have a sufficiently high growth rate at the substrate. Temperatures up to about 250° C. have been used for the deposition of copper from trialkylphosphine (cyclopentadienyl) copper I complexes. If the temperature is too great, there could be adverse decomposition of the precursor in the gaseous phase, causing impurities in the deposited film. These higher temperatures would cause secondary decomposition of phosphine and hydrocarbons would appear in the deposited film. Further, the low growth temperatures (120°-250° C.) are sufficiently low that growth onto most polymer substrates can be undertaken since these temperatures are less than the glass transition temperature of most polymers. Still further, a temperature of 120°-150° C. is less than the temperatures (about 175° C.) at which resist materials are altered.

Generally, vacuum systems are used for CVD of these metals. There is no criticality with respect to the pressure in the system, operating pressures of 10-100 mTorr having been used. These pressures are determined by the vapor pressure of the precursor complex, and inert carrier gasses can be added to increase the total pressure. However, there is no need to do so.

As will be seen from the examples to follow, high quality metal films can be deposited with thicknesses dependent upon the time and temperature of deposition. Continuous films have been deposited from about 500 angstroms to about 4.5 microns. The electrical conductivity of these films generally increases as the thickness increases due to the reduction of electron scattering in the grain boundaries, which is a property of the metals. Thus, films having a thickness of about 1000 angstroms and more are most suitable for device purposes.

CVD Apparatus

Figure 2:
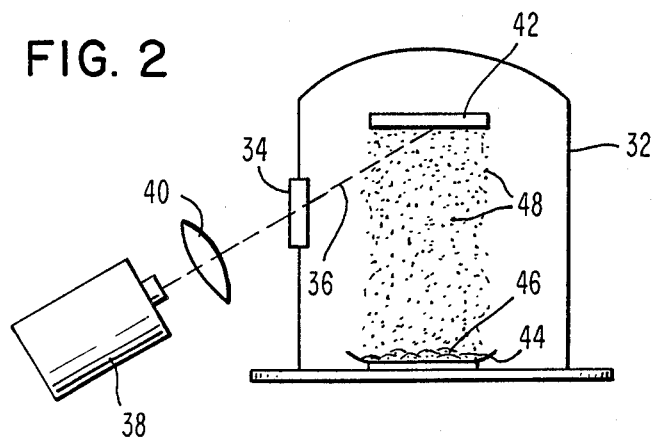
FIG. 2 schematically represents one of many different types of apparatus that can be used to accomplish radiation beam-induced CVD in accordance with the principles of the present invention.

Representative apparatus for CVD of group IB metals such as Cu, Ag and Au are shown in FIGS. 1 and 2. In FIG. 1, a CVD reactor 10 is shown which is suitable for thermal CVD of these metals. Reactor 10 is comprised of a vacuum chamber 12, a support holder 14 separated therefrom by the sealing O-rings 16, and a pumping apparatus 18 including the valve 20 and pumps (not shown) for providing different levels of vacuum in the chamber 12. A substrate holder 22, such as a copper block, holds the substrate 24. Holder 22 is heated, as by resistive heating, using the heater 26. Thermocouple wires 28 are provided to holder 22 in order to measure the temperature of the substrate holder, and therefore the approximate temperature of the substrate 24. The compound 30 which sublimes at a slightly elevated temperature to produce the gaseous precursor containing the metal to be deposited is located at the bottom of chamber 12. This type of apparatus is well known in the art, and is representative of many different structures that can be used in the practice of thermal CVD in accordance with the present invention.

In operation, the compound 30 is loaded into the reactor chamber 12, and a vacuum of about 10$^{-3}$ Torr is applied to clean the reactor chamber. After this, the pressure is raised to about 10$^{-1}$ Torr which is a suitable deposition pressure. As noted previously, the pressure in the system is not critical.

The compound 30 is a solid at room temperature and has a vapor pressure in the millitorr range at room temperature. These compounds are somewhat air-stable and do not need to be loaded into the chamber 12 under an inert atmosphere. In order to obtain reasonable transport rates, the exterior walls of the reactor 12 are generally heated to about 70° C. The reactor can be evacuated with a trapped diffusion pump vacuum system and the substrate then heated to the desired temperature (about 150°-220° C.). The compound 30 then sublimes and the vapors are transported to the vicinity of the heated substrate 24. This initiates decomposition of the gaseous precursor and deposition of the metal onto the substrate 24. Deposition generally continues until all of the precursor complex is transported, which can be typically 15-30 minutes. Unreacted precursor complex will condense in the lines between the reactor and the pump, while more volatile products can be trapped in a liquid nitrogen trap in order to allow subsequent analysis.

FIG. 2 shows a radiation beam-induced deposition system in which the radiation source is chosen to be a laser. In more detail, the reaction chamber 32 includes a window 34 through which the beam 36 from the laser 38 enters chamber 32. The laser output is focussed by lens 40 and is directed to the substrate 42 on which deposition is to occur. A boat 44 contains the solid compound 46 which sublimes to produce the gaseous precursor indicated by the particles 48.

In operation, the focussed laser beam 36 heats the surface of the substrate 42 on which it is incident, in order to raise the temperature of the substrate sufficiently that decomposition of the gaseous precursor will be produced at the substrate surface. The wavelength of the laser radiation is generally chosen to be in the range where it would be absorbed by the substrate in order to heat the substrate. It is preferable that the wavelength of the radiation not be so short that the gaseous precursor will decompose in the gaseous state. This generally means that the laser wavelength should be in the visible or infrared range, and should not be in the ultraviolet range, as UV wavelengths are sufficiently short that they will be absorbed in these gaseous precursor molecules. As will be seen from the examples to follow, wavelengths in the range of about infrared-350 nm are generally used.

In operation, chamber 32 is evacuated by the pumping system (not shown) and the walls of the chamber are heated somewhat to increase the transport rate of the vapors 48. When the laser is turned on, the surface of substrate 42 will be heated and the gaseous precursor will decompose at that location, depositing the metal thereon. The pumping system can be used to remove gaseous byproducts to give high purity deposition.

EXAMPLES

The following examples illustrate the deposition of copper onto various substrates using both thermal reactor CVD and radiation beam-induced CVD. The same general principles and results would follow if the deposited metal were Ag or Au.

EXAMPLE I

A 500 angstrom Cr film was evaporated onto a 1" Si wafer, and this wafer was attached to the substrate holder 22 of the reactor shown in FIG. 1. The reactor was charged with 200 mg of triethylphosphine (cyclopentadienyl) copper(I) in air. The reactor was sealed, and a water-ice bath was placed around the outside of the reactor. The reactor was evacuated to a pressure of $10^{-3}$ Torr, and the substrate holder 22 was heated to a temperature of 215° C. The water-ice bath was replaced by a 70° C. water bath. This temperature change increased the pressure in the reactor to between $10^{-2}$ and $10^{-1}$ Torr, and copper deposition was observed almost immediately. After 30 minutes all of the precursor compound had transported. The apparatus was filled with gaseous $N_2$, and allowed to cool to room temperature. The resulting Cu film was 4.4 microns thick, showed no impurities detectable by Auger spectroscopy, and had a resistivity (measured with a four-point probe), of $2.02 \pm 0.05$ micro ohm-cm. (The bulk resistivity of Cu is 1.70 micro ohm-cm.)

EXAMPLE II

A Si wafer was thermally oxidized and subsequently patterned into a series of trenches of varying width. A 200 angstrom barrier layer was sputtered onto the wafer. Following the general procedure of Example I, a 1.3 micron Cu film was deposited on a substrate heated to a temperature of 175° C. After deposition, the wafer was cleaved and a scanning electron micrograph was taken. This micrograph clearly showed a continuous polycrystalline Cu film, and excellent conformal deposition into a 1×2 micron trench. The resistivity of the film was 2.1 micro ohm-Cm.

EXAMPLE III

A 500 angstrom Cr layer was deposited on a Si wafer, and a 5.5 micron polyimide layer was deposited on top of the Cr layer. The polyimide layer was patterned to expose the Cr layer at the bottom of 5 micron wide trenches. The general procedure of Example I was followed again using the apparatus of FIG. 1, except that the substrate temperature was 150° C. A 2000 to 3000 angstrom Cu layer deposited on the Cr layer without appreciable deposition on the polyimide, indicating a thermal barrier to nucleation on polyimide. (If the substrate temperature were increased, deposition onto the polyimide would occur.)

EXAMPLE IV

Twenty milligrams of triethylphosphine(cyclopentadienyl)copper(I) was sealed in an evacuated cell 32 (FIG. 2) equiped with a transparent window 34. The cell was evacuated and a silicon wafer 42 contained in the cell was irradiated with an Ar-CW (514 nm) laser for a period of five minutes. Copper colored spots were observed on the wafer and on the window. The thickness of the spots was about 1.5 microns, with a diameter of about 300 microns. The laser power was estimated to be $5 \times 10^3$ watts/cm$^2$. Auger analysis indicated that the spots were copper, with no detectable impurities. Similar results were obtained on $SiO_2$ substrates. These results demonstrate the feasibility of using this Cu source for circuitry repair.

EXAMPLE V

Following the general procedure of Example IV, except that the cell 32 was heated to 70° C. to increase the deposition rate, copper lines were "written" onto a polyimide covered silicon wafer by translating the cell under a narrow fixed laser beam 36. The lines were typically 10 microns wide and 1 micron thick. Auger analysis indicated no detectable impurities in the copper lines. These results indicate that the higher temperatures of laser deposition overcome the surface selectivity described in Example III, and demonstrate the feasibility of using this compound to "write" electronic circuitry onto thermally sensitive substrates.

EXAMPLE VI

Previous examples (IV, V) described photothermal deposition of Cu from the precursor complex triethylphosphine (cyclopentadienyl)copper(I) using laser wavelengths (such as 514 nm) that are absorbed by the substrates but not by the precursor. In the present example UV laser wavelengths (248, 308 nm) are used that are strongly absorbed by the precursor and which can photochemically decompose the precursor. In all laser-induced photochemical deposition examples, the chamber 32 was heated to 70° C. to increase the deposition rate by increasing the vapor pressure of the precursor. While UV laser pulses can produce Cu deposition, the resulting films are not of as high purity as those deposited by either thermal CVD or photo thermal processes.

Patterned copper lines were deposited on Si wafers by mask projection techniques using an excimer laser operating at 248 nm, where this precursor absorbs strongly. Typical conditions were 500 pulses at 5 Hz with a power density of $\simeq$150 mJ/cm$^2$, producing films $\simeq$1500 angstroms high, which are made of uniformly distributed 500–1000 angstrom size particles. The thickness of the copper deposition from the 248 nm excimer light did not appear to be self-limiting. Features two microns high were produced with 2500 laser pulses. The thin deposits of copper were shiny copper colored, but as the thickness increased with prolonged exposure, the film became noticeably roughened and darker. The morphology of the 2 $\mu$m feature is dominated by 5000 angstrom sized particles which are slightly fused together to form a several micron scale surface roughness. The fusing together of the grains could be indicative of high peak temperatures and slight flowing during the intense excimer laser pulse. This structure is to be contrasted with the open stacked structure of the thermally deposited material using a laser wavelength (514 nm) which is not absorbed by the precursor vapor. Auger depth profiles indicate that the deposit is a uniform, even mixture of copper and carbon, with no detectable phosphorous. A plausible explanation for the observed metal quality is clean liberation of the phosphine ligand, but either entrapment or laser fragmentation of the cyclopentadienyl ligand. This explanation agrees with the proposed route for the thermal decomposition involving initial dissociation of the phosphine ligand, followed by reduction of the copper with elimination of the cyclopentadienyl ligand. It was not determined whether the carbon impurities are in the form of incorporated amorphous carbon or intact cyclopentadiene complexes.

The average growth rate for the 2 $\mu$m high feature is 8 angstroms per laser pulse, but there appears to be an induction period or a period of slow growth at the onset of decomposition. Making the assumption that growth is occurring only during the 30 nsec width of the laser pulse, several monolayers of material growth per laser pulse corresponds to an average growth rate approaching $3 \times 10^4$ $\mu$m/sec. This is probably an upper bound on the growth rate since any photothermal process would necessarily exhibit material growth over a "cooling" time longer than the excimer laser pulse width. These results are not sufficient to determine whether decomposition is occuring in the gas phase or in an adsorbed layer since the observed growth rate of several monolayers per laser pulse could be obtainable in either case. The collision rate expected at the operating pressure of several hundred mTorr, although insufficient to supply adsorbed precursor during the laser pulse (5–10 $\mu$sec/monolayer), is probably sufficient to saturate any surface adsorbed phase in the time between laser pulses. It is also noted that there are $\simeq$100 incident photons per deposited molecule making a gas phase precursor possible. The moderate degree of spatial resolution achieved during the projection deposition would indicate a significant contribution of growth from decomposition at or near the surface as opposed to gas phase dissociation far from the surface which would produce only broad featureless deposits.

To see if the excimer induced deposition could be due to laser light absorption in the substrate followed by thermal decomposition, the experiment was repeated with a XeCl excimer laser operating at 308 nm, where copper and silicon still absorb strongly, but where the laser absorption by the precursor vapor has decreased by an order of magnitude. Films with a limiting thickness of $\simeq$1000 angstroms were grown on silicon or on 2000 angstroms SiO$_2$ on silicon with a power density of 200 mJ/cm$^2$. The compositions of the copper films as determined by Auger spectroscopy were $\simeq$65% carbon, $\simeq$35% copper with no detectable phosphorus or oxygen. There were clear indications that deposition occurred with 308 nm irradiation only after an initial damaging of the Si or SiO$_2$ surface. In contrast, the 248 nm excimer irradiation produced copper films without apparent damage to the silicon surface. It is not possible to say whether the absorption at 248 nm is occurring entirely in the organometallic precursor, or if absorption in the contaminated copper film (which may contain large amounts of hydrocarbon) plays an important role.

Both thermal (including photothermal) and U.V. laser induced laser deposition of copper was demonstrated for the first time from triethylphosphine(cyclopentadienyl)copper(I). This volatile organometallic compound, which decomposes cleanly to copper at 150° C., can be used for metallization of thermally sensitive materials.

The copper films deposited by thermal CVD were characterized by Auger spectroscopy, electrical resistivity measurements, and transmission electron microscopy (TEM). After sputtering the first approximately 200 angstroms, more of the Auger spectra showed any impurity in the copper films. The resistivity of six films of between 4.4 and 0.3 microns thickness was measured with a four-point resistivity tester. The average resistivity of these films was 2.05$\pm$0.05 micro-ohm-cm, a value only slightly higher than that of bulk copper (1.7 micro-ohm-cm). For a representative film deposited at 165° C., the grains are tightly packed and the grain boundaries are free of precipitates. The average grain size is 0.8 microns, which is comparable to that of sputtered film deposited at 300°–400° C.

The primary reason for deposition of metals by CVD as opposed to evaporation or sputtering is the ability of CVD to conformally cover all surfaces, including via holes which may be of submicron dimension. As a test of conformality, an oxidized Si wafer which had been patterned in a series of trenches of varying dimension was sputtered with a thin seed layer of TiN, and 1.3 microns of Cu was deposited by thermal CVD at 180° C. The wafer was then cleaved to expose the trenches, and scanning electron micrographs (SEM) were obtained. These showed a 5 micron wide by 2 micron deep trench with excellent step coverage, as well as a 1 micron wide by 2 micron deep trench which had been completely "plugged", with very good conformality. The surface roughness was on the order 2000–3000 angstroms.

While it will be appreciated by those of skill in the art that thermal CVD and photothermal deposition of copper produces the highest quality films, plasma induced deposition can also be used with these gaseous precursors. However, the quality of the films deposited using plasma induced techniques is not expected to be as favorable.

It will also be appreciated by those of skill in the art that the metals which are deposited by the improved processes of this invention can be used for a variety of purposes. For example, they can be used for interconnect wiring, repair of circuits, deposition of contacts, etc. Further, since sources now exist for the chemical vapor deposition of aluminum, it is possible to produce copper-doped aluminum conductors in order to improve the electromigration properties of CVD aluminum films. It appears that the precursors used for aluminum CVD and the precursors described in the present invention are compatible with one another in order to allow simultaneous deposition of Cu and Al. As an example of a process for depositing aluminum by CVD, reference is made to U.S. Pat. No. 3,375,129 wherein a thermally decomposable vapor of an amine complex of aluminum hydride is described. As an alternative separate layers of Al and Cu can be deposited, then annealed to form a Cu-Al conductor.

In the practice of the present invention, thermal reactor CVD as well as photothermal and photochemical CVD techniques were described for the deposition of Cu and other group IB metals onto many different types of substrates. In particular, different types of apparatus are suitable for the deposition of these metals, specific examples being shown in FIGS. 1 and 2 for the deposition of Cu, Ag, and Au. While the invention has been described with respect to particular embodiments thereof, it will be apparent to those of skill in the art that variations may be made thereto without departing from the spirit and scope of the present invention. For example, while temperatures less than about 250° C. have been mentioned, these temperatures can be raised if desired. However, no grain growth has been observed during the deposition of these metal films at temperatures below 500° C., and therefore there appears to be no reason to use higher substrate temperatures for the deposition. One advantage of a low temperature process is that deposition can occur onto thermally sensitive substrates and the chance for secondary decomposition of the gaseous precursor is minimized, thereby allowing the deposition of high purity films. However, it is recognized that operating parameters such as temperature, pressure, the use of inert gases, flow rate, etc. can be varied within the scope of this invention. Further, it is noted that other substituents may be usable on the cyclopentadienyl ring, as for example aryl groups or H substituents for an alkyl fragment.

Having thus described our invention what we claim as new and desire to secure as Letters Patent, is:

1. A method for depositing a group IB metal, said method including the step of decomposing onto a substrate a vapor of a precursor comprising a cyclopentadienyl ring, a 2 electron donor ligand selected from the group consisting of trivalent phosphines, amines, and arsines, and said group IB metal which is present in said precursor in a +1 oxidation state.

2. The method of claim 1, where said metal is selected from the group consisting of Cu, Ag, and Au.

3. The method of claim 1, where said cyclopentadienyl ring includes substituents thereon, said substituents selected from the group consisting of alkyl, halide, and psuedo halide groups.

4. The method of claim 1, where said substrate is at a temperature sufficiently high to decompose said vapor of the precursor.

5. The method of claim 4, where the temperature of said substrate is less than about 400° C.

6. The method of claim 4, where the temperature of said substrate is between about 120° C. and 300° C.

7. The method of claim 1, where said substrate is selected from the group consisting of glossy insulators such as oxides, polymers, metals, ceramics and semiconductors.

8. The method of claim 1, where said method deposits said group IB metal conformally on a substrate having recesses therein.

9. The method of claim 1, where said step of decomposing said vapor occurs at a temperature less than about 500° C.

10. The method of claim 1, where said substrate is heated by a radiation beam.

11. The method of claim 10, where said radiation beam is produced by a laser.

12. A method for depositing a metal selected from the group consisting of Cu, Ag, and Au, including the steps of:

heating a substrate onto which deposition of said metal is to occur, said substrate being located in a deposition chamber, producing a vapor of a precursor containing said metal in said chamber in the vicinity of said substrate, said precursor including a cyclopentadienyl ring, a 2 electron donor ligand attached thereto, said ligand being selected from the group consisting of trivalent phosphines, amines, and arsines, and said metal to be deposited in a +1 oxidation state, decomposing said vapor to deposit said metal on said substrate.

13. The method of claim 12, where said deposited metal includes less than about 15% carbon.

14. The method of claim 12, where said method is a chemical vapor deposition method.

15. The method of claim 12, where the temperature of said substrate is sufficiently high that said vapor will decompose at said substrate to deposit said metal thereon.

16. The method of claim 12, where a vapor precursor containing aluminum is also present in said chamber, said vapor containing aluminum being decomposed to deposit aluminum on said substrate simultaneously with the deposition of said metal thereon.

17. The method of claim 12, including the further steps of decomposing a vapor containing Al to deposit an Al film, and annealing the resulting Al-Cu composite to produce a Cu doped Al layer.

18. The method of claim 12, where said cyclopentadienyl ring includes at least one substituent thereon selected from the group consisting of alkyl, halide, and psuedo halide groups.

19. The method of claim 12, where said substrate is heated by a beam of radiation incident thereon.

20. The method of claim 19, where said beam of radiation is produced by a laser.

21. The method of claim 12, where said substrate has recesses thereon, said metal being deposited in said recesses.

22. The method of claim 21, where said recesses are located in a polymer layer.

23. The method of claim 12, where said substrate is heated to a temperature less than 500° C.

24. The method of claim 12, where said metal is copper and said substrate has copper lines thereon onto which said method deposits copper for repair of said copper lines.

25. A thermal CVD method for depositing copper onto a substrate, comprising the steps of:

placing said substrate in a chamber into which a vapor of a Cu precursor is produced, heating said substrate, producing a vapor of said precursor in said chamber, said vapor transporting to said substrate to be decomposed thereat, said Cu precursor being a cyclopentadienyl ring of copper and including a 2 electron donor ligand, said ligand being selected from the group consisting of trivalent phosphines, amines, and arsines, said copper being present in said precursor in a +1 oxidation state, and decomposing said vapor to deposit copper therefrom onto said substrate.

26. A method of claim 25, where the temperature to which said substrate is heated is sufficient to decompose said vapor.

27. The method of claim 26, where said substrate is heated by a laser beam.

28. The method of claim 25, where said cyclopentadienyl ring of Cu has substituents thereon selected from the group consisting of alkyl, halide, and psuedo halide groups.

29. The method of claim 25, where the temperature of said substrate during deposition thereon is less than about 500° C.

30. The method of claim 25, where said chamber is essentially a cold wall, heated substrate apparatus.

31. The method of claim 25, where said chamber is heated to promote the transport of said vapor therein.

32. A method for chemical vapor deposition of Cu, including the following steps:
  placing a substrate in a reaction chamber,
  evacuating said chamber to remove contaminants therefrom,
  producing a vapor of a Cu precursor in said chamber, said precursor being a cyclopentadienyl ring of copper having attached thereto a 2 electron donor ligand, said ligand being selected from the group consisting of trivalent phosphines, amines, and arsines, said copper being present in said precursor in a +1 oxidation state,
  heating said substrate,
  transporting said vapor to said substrate, the temperature of said substrate being sufficient to decompose said vapor to deposit copper on said substrate.

33. The method of claim 32, where said precursor is a cyclopentadienyl-trialkyl phosphine complex.

34. The method of claim 32, where said substrate is heated by radiation from a laser.

35. The method of claim 32, where said substrate is heated to a temperature less than about 400° C.

36. A method for chemical vapor deposition of a Cu-doped Al film, including the following steps:
  placing a substrate in a reaction chamber,
  evacuating said chamber to remove contaminants therefrom,
  producing a first vapor of a Cu precursor in said chamber, said precursor being a cyclopentadienyl ring of copper having attached thereto a 2 electron donor ligand selected from the group consisting of trivalent phosphines, amines, and arsines, said copper being present in said precursor in a +1 oxidation state,
  producing a second vapor of an Al precursor in said chamber,
  heating said substrate,
  transporting said first and second vapors to said substrate, and decomposing said vapors to deposit Cu and Al on said substrate, thereby producing said Cu doped Al film.

37. The method of claim 36, where said Cu precursor is a cyclopentadienyl-trialkyl phosphine complex.

38. The method of claim 36, where said substrate is heated by radiation from a laser.

39. A method for chemical vapor deposition of a Cu doped Al layer including the following steps:
  placing a substrate in a reaction chamber,
  evacuating said chamber to remove contaminants therefrom,
  producing a first vapor of a Cu precursor in said chamber, said precursor being a cyclopentadienyl ring of copper having attached thereto a 2 electron donor ligand
  selected from the group consisting of trivalent phosphines, amines, and arsines, said copper being present in said precursor in a +1 oxidation state,
  heating said substrate,
  transporting said first vapor to said substrate,
  decomposing said first vapor to deposit copper on said substrate,
  producing a second vapor of an Al precursor in said chamber,
  transporting said second vapor to said substrate to deposit Al thereon, producing an Al-Cu composite, and
  annealing said Al-Cu composite to produce a Cu-doped Al layer.

40. The method of claim 39, where said precursor is a cyclopentadienyl-trialkyl phosphine copper complex.

41. A method for depositing a group IB metal into a via in a substrate including the step of decomposing into said via a vapor of a precursor comprising a cyclopentadienyl ring, a 2 electron donor ligand selected from the group consisting of trivalent phosphines, amines, and arsines, and said group IB metal which is present in said precursor in a +1 oxidation state, said deposited metal forming an electrically continuous conductor in said via.

* * * * *